(12) United States Patent
Heidari

(10) Patent No.: US 7,195,734 B2
(45) Date of Patent: Mar. 27, 2007

(54) DEVICE AND METHOD IN CONNECTION WITH THE PRODUCTION OF STRUCTURES

(75) Inventor: Babak Heidari, Furulund (SE)

(73) Assignee: Obducat AB, Malmö (SE)

( * ) Notice: Subject to any disclaimer, the term of this patent is extended or adjusted under 35 U.S.C. 154(b) by 362 days.

(21) Appl. No.: 10/149,072

(22) PCT Filed: Dec. 4, 2000

(86) PCT No.: PCT/SE00/02417

§ 371 (c)(1),
(2), (4) Date: Nov. 26, 2002

(87) PCT Pub. No.: WO01/42858

PCT Pub. Date: Jun. 14, 2001

(65) Prior Publication Data

US 2003/0159608 A1     Aug. 28, 2003

(30) Foreign Application Priority Data

Dec. 10, 1999     (SE)     .................................. 9904517

(51) Int. Cl.
   *B28B 1/10*     (2006.01)
(52) U.S. Cl. ........................ 264/667; 264/570; 425/419
(58) Field of Classification Search ................ 425/419, 425/421, 425, 432, 405.1; 264/667, 77, 570
   See application file for complete search history.

(56) References Cited

U.S. PATENT DOCUMENTS

| | | | |
|---|---|---|---|
| 5,378,134 A * | 1/1995 | Blot et al. ................... | 425/149 |
| 5,507,996 A * | 4/1996 | Brouard ....................... | 264/333 |
| 5,670,228 A * | 9/1997 | Kakamu et al. ............... | 428/49 |
| 5,772,905 A | 6/1998 | Chou ........................... | 216/44 |
| 5,947,027 A | 9/1999 | Burgin et al. ................ | 101/474 |
| 5,956,216 A | 9/1999 | Chou | |
| 6,019,587 A * | 2/2000 | Takahashi et al. ............. | 425/3 |
| 6,030,576 A * | 2/2000 | Cassani ....................... | 264/570 |
| 6,482,742 B1 | 11/2002 | Chou ........................... | 438/690 |
| 2002/0132482 A1 | 9/2002 | Chou ........................... | 438/692 |
| 2003/0189273 A1* | 10/2003 | Olsson ......................... | 264/293 |
| 2004/0219249 A1* | 11/2004 | Chung et al. .................... | 59/2 |

FOREIGN PATENT DOCUMENTS

| | | |
|---|---|---|
| JP | 01-241046 | 9/1989 |
| WO | WO 02/07199 A1 | 1/2002 |

* cited by examiner

*Primary Examiner*—Joseph S. Del Sole
*Assistant Examiner*—Emmanel S. Luk
(74) *Attorney, Agent, or Firm*—Albihns Stockholm AB

(57) ABSTRACT

Device in connection with the lithography of structures of nanometer size, which device comprises a first main part (1) with a first principally plane surface (2a) and a second main part (3) with a second principally plane surface (9a), said first surface and second surface being opposite to one another and being arranged in principle parallel in relation to one another, with an adjustable interval between them, and said first and second surface being arranged to form a support for a substrate (5) and a template (10) respectively, or vice-versa. According to the invention, said second main part (3) also comprises a cavity (6) for a medium, and means for adjusting a pressure of said medium, a wall of said cavity consisting of a flexible membrane (9), of which one side, which side faces away from the cavity (6), forms said second surface (9a). The invention also relates to a method that utilizes the device.

25 Claims, 8 Drawing Sheets

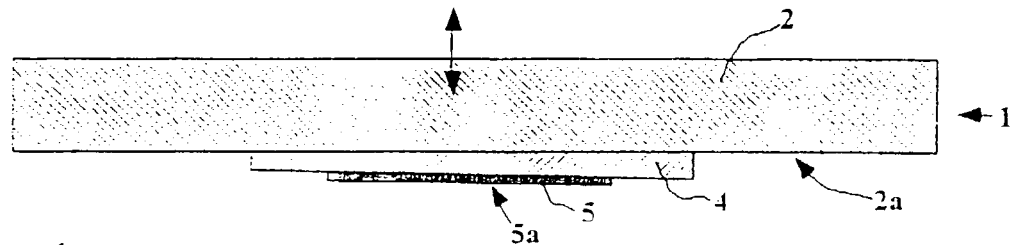
Figure 1
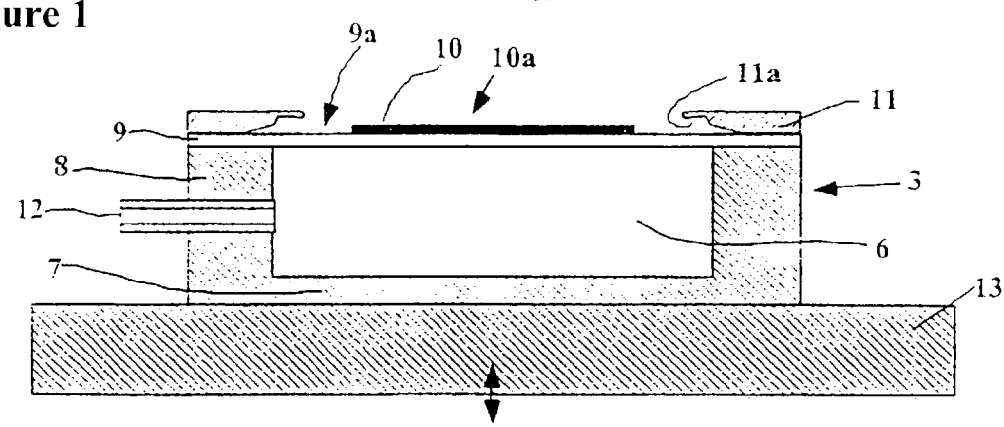
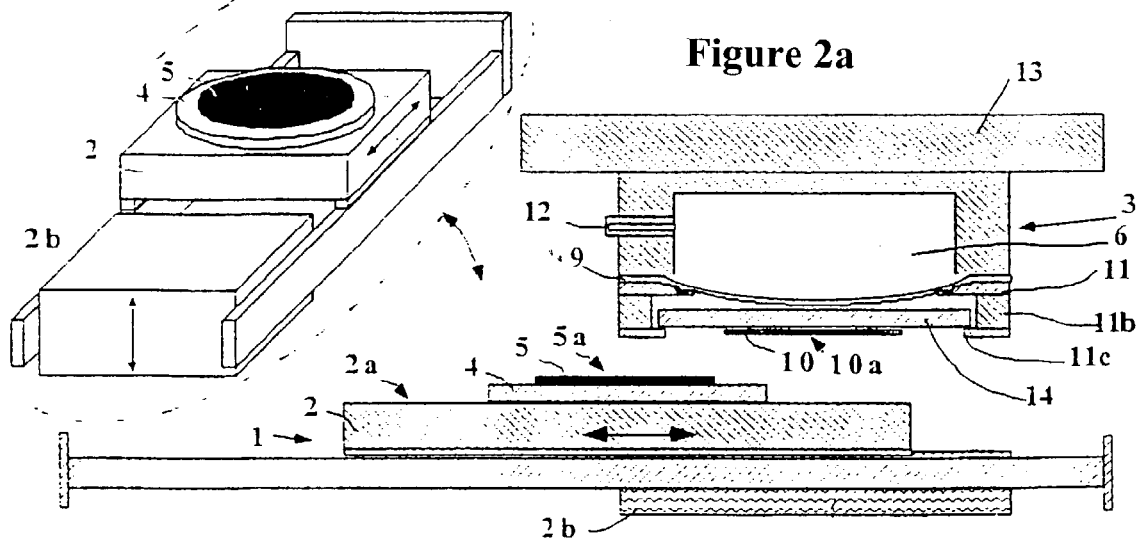
Figure 2b
Figure 2a

Figure 3a
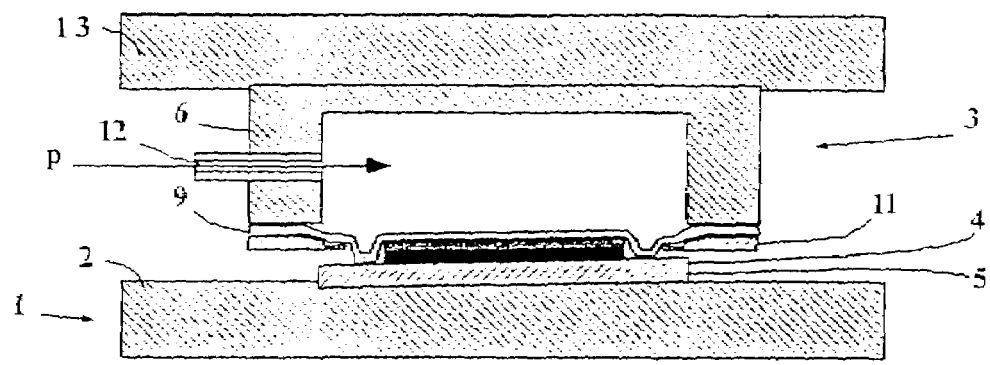
Figure 3b
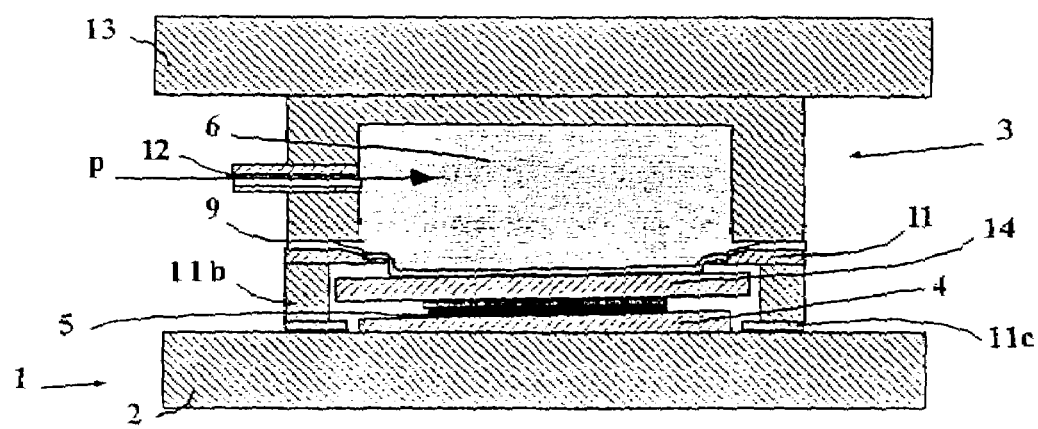
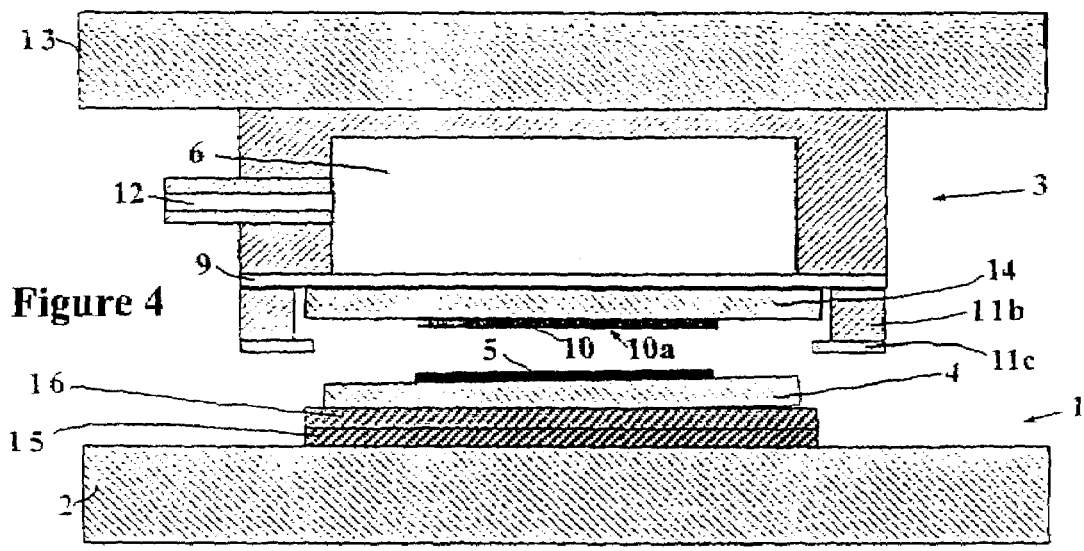
Figure 4

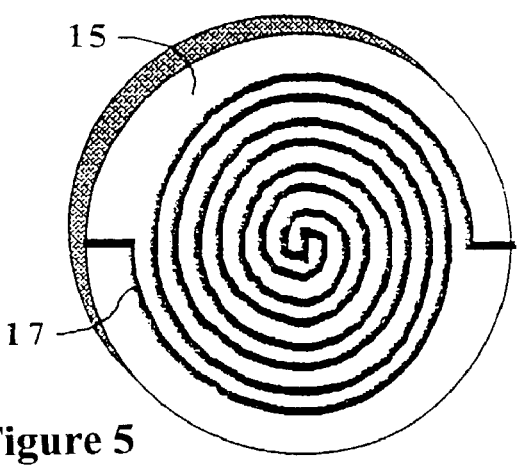
Figure 5
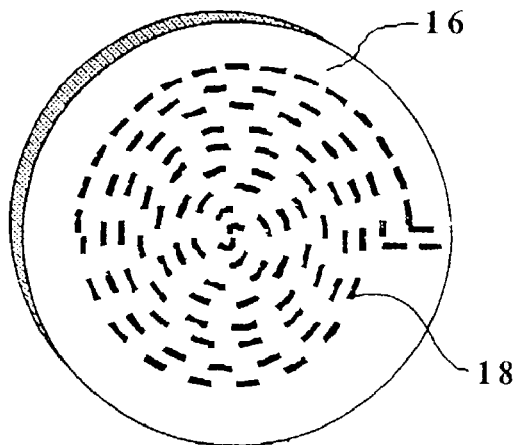
Figure 6
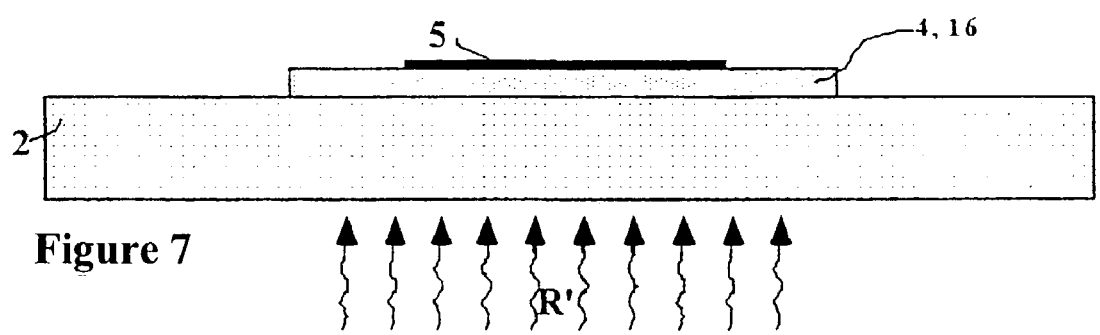
Figure 7
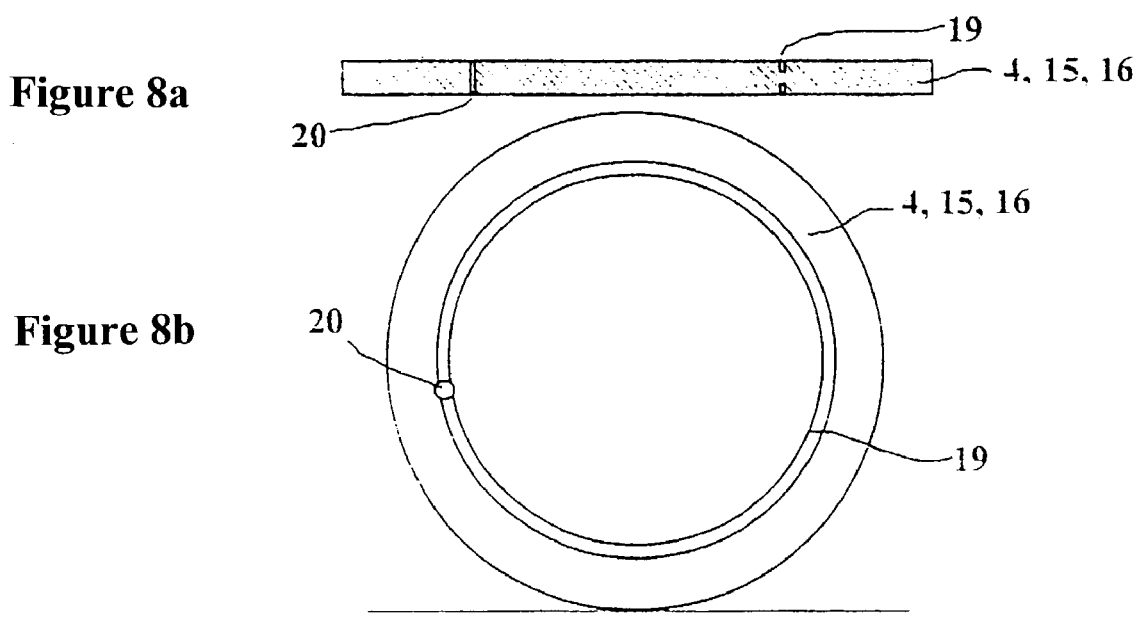
Figure 8a
Figure 8b

DEVICE AND METHOD IN CONNECTION WITH THE PRODUCTION OF STRUCTURES

This application is the national phase under 35 U.S.C. § 371 of PCT International Application No. PCT/SE00/02417 which has an International filing date of Dec. 4, 2000, which designated the United States of America.

TECHNICAL FIELD

The invention relates to a device in connection with the lithography of structures of nanometer size, which device comprises a first main part with a first principally plane surface and a second main part with a second principally plane surface, said first surface and second surface being opposite to one another and arranged substantially parallel in relation to one another, with an adjustable interval between them, and said first and second surface being arranged to provide support for a substrate or template respectively, or vice versa. The invention also relates to a method in connection with the lithography of structures of nanometer size. The invention is applicable in connection with nanoimprint lithography on semiconductor materials, such as silicon, indium phosphide or gallium arsenide, for the manufacture of semiconductor components, but also in connection with nanoimprint lithography on other rigid materials, such as ceramic materials, metals or polymers with a relatively high glass transition temperature, for use in e.g. biosensors.

PRIOR ART

The trend in microelectronics is towards ever smaller dimensions. In principle, development has been such that the dimensions are being halved every third year. Commercial components are now manufactured with structures of roughly 200 nm in size, but there is a need to go even further down in dimensions, to <100 mn. Research concerning components based on quantum effects is now highly topical and a demand is being created for a commercially applicable manufacturing technique for components with dimensions <10 nm. These nanocomponents can be produced currently using serial technology in individual specimens, for research purposes, but for mass production a parallel production method is required. A parallel production method of this kind that has recently been developed is nanoimprint lithography (NIL), U.S. Pat. No. 5,772,905, which has set out the basic preconditions for the mass production of structures close to atomic scale, see Stephen Y. Chou, Peter R. Krauss, Wei Zhang, Lingjie Guo and Lei Zhuang: "*Sub-10 nm imprint lithography and application*", *J. Vac. Sci. Technol. B*, Vol. 15, No. 6, (1997). Several research reports have been presented on the subject, but hitherto the method has been restricted to nanoimprinting on components with a small total area, typically only a few square centimeters, see Stephen Y. Chou, Peter R. Krauss and Preston J, Renstorm: "*Nanoimprint lithography*", *J. Vac. Sci. Technol. B*. 14, 4129 (1996); K. Pfeiffer, G. Bleidiessel, G. Gruetzner, H. Schulz, T. Hoffinann, H.-C. Scheer, C. M. Sotomayor Torres and J. Ahopelto: "*Suitability of new polymer materials with adjustable glass temperature for nanoimprinting*", *Proceeding of Micro- and Nano-Engineering Conference*, (1998); and Leuven. Bo Cui, Wei Wu, Linshu Kong, Xiaoyun Sun and Stephen Y Chou: "*Perpendicular quantized magnetic disks with 45 Gbits on a 4×4 cm² area*", *J. Appl. Phys*. 85, 5534 (1999).

However, no commercial equipment for NIL has yet been presented, which is due in large part to the fact that an entirely new approach is required for the manufacture of nanometer-sized structures. The production of such small dimensions puts considerably higher demands than before on all constituent process stages, new process materials, new designs and new technical solutions having to be developed. The need for mass production of nanometer-size structures is great, however, and opens up entirely new possibilities for the design of more compact circuits and sensors for various applications with considerably greater sensitivity than those of today.

The basic principle of NIL is mechanical deformation of a thin film layer, which is coated onto a plane plate of silicon. The NIL process can be compared with the production process for CDs and can be described in three stages:

1. Production of template: A template can be produced from various materials, e.g. metal, semiconductor, ceramic or of certain plastics. To create a three-dimensional structure on one surface of the template, various lithographic methods can be used, depending on the requirements for the size of the structure and its resolution. E-beam and X-ray lithography are normally used for structure dimensions that are less than 300 nm. Direct laser exposure and UV lithography are used for larger structures.

2. Imprint: A thin layer of a polymer, e.g. polyamide, is applied to a plane substrate of silicon. The layer is heated and at a certain temperature, the so-called imprint temperature, the predefined template and substrate are pressed together, the inverse of the template's structure being transferred in the polymer layer to the substrate.

3. Structure transfer: In the areas pressed together in the polymer layer, a thin layer of polymer remains. The last stage is removal of this thin remaining layer on the substrate. This is carried out in a so-called "RIE" or oxygen plasma unit. The thinner this remaining layer is, the finer the structures that can be created using the nanoimprint process.

In the imprint stage (2) it is essential that the template and the substrate are arranged absolutely parallel in relation to one another. In known devices, however, there are a number of sources of error that cause problems with a lack of parallelism. In some of the known devices, e.g. in the "Flip Chip" bonder, the parallelism between the surfaces is therefore measured, following which mechanical adjustment is undertaken using special devices, e.g. piezoelectric components, to ensure that the surfaces remain parallel in relation to one another. See Alberto Jaramillo-Nunez, Carlos Robledo-Sanchez, and Alejandro Cornejo-Rodriguez: "*Measuring the parallelism of transparent and nontransparent plates*", *Optical Engineering*—December 96-V. 35, Issue 12, pp. 3437–3441. This type of measurement and adjustment is complicated, however, and is in itself marred by sources of error, which obstruct parallelism between the template and substrate.

Furthermore, there are structural variations in the material in the surface of a plane plate, or in other words, on a nanometer scale, there exists an unevenness in the surface of each plate (template and substrate), even if the plates are polished. These unevennesses lead to an undesirable uneven distribution of force over the surfaces when the template and substrate are pressed together, which in turn results in an unevenly depressed structure on the substrate. This is particularly critical for the imprint process if the plates are large, e.g. the size of the surfaces is more than 50 mm in diameter.

There are thus two main problems to solve for the commercial production of nanometer-sized structures using the imprint technique. One problem is parallelization of the plane surfaces that are to be pressed together and the other problem is providing an even distribution of force over the entire plane surface. Solving these problems is a prerequisite for a commercial process for nanoimprint lithography of materials for semiconductor components on surfaces with total areas that are greater than approx. 7–20 cm$^2$.

BRIEF ACCOUNT OF THE INVENTION

The object of the present invention is to provide a device and method in connection with the lithography of structures of nanometer size, by means of which device and method the above problems with regard to parallelism between the substrate and template, and an even distribution of force on compression, are solved. In particular, the device and method have been developed for nanoimprinting structures on materials for semiconductor components, which materials have total areas, normally circular areas, which are greater than 7–20 cm$^2$, but can also be applied for nanoimprinting structures on other materials that have a certain rigidity, i.e. that are not flexible. Naturally, the invention can also be applied for nanoimprinting structures on materials that have smaller total surfaces.

According to the invention, a device is thus presented according to the preamble, characterized in that the second main part also comprises a cavity for a medium, and means for adjusting a pressure of said medium, a wall of the cavity consisting of a flexible membrane, of which one side, which side faces away from the cavity, forms the second surface.

The template is thus supported according to the invention by a flexible membrane, which membrane is pressurized on its opposite side, at the same time as the substrate, or vice versa, is supported by a fixed and stable surface. With this, the substrate and template will be arranged absolutely parallel in relation to one another and at the same time the distribution of force on pressing together the substrate and template will be absolutely even over the surfaces of the substrate/template. The invention thus builds, simply but brilliantly, on a utilization of physical principles, which eliminate the need for time-consuming, costly and unreliable measuring and adjustment of the parallelism between substrate and template.

According to one aspect of the invention, the membrane consists of a flexible material, preferably a polymer material or a thin metal, even more preferredly plastic, rubber or thin metal, the membrane having a thickness of up to 10 mm, preferably up to 3 mm and even more preferredly up to 1 mm. There is actually no lower limit to the thickness of the membrane, other than a practical one, in which case the ultimate should be a membrane with a thickness that corresponds to a single atom layer, which at least in the present situation is virtually impossible. The membrane is best fixed in the case of the second main part around the periphery of the membrane, at the edges of the cavity, and otherwise deflectably.

According to another aspect of the invention, said medium consists of a gas or a liquid with low compressibility, preferably an oil or even more preferredly hydraulic oil. A simple oil such as e.g. brake fluid can also be used. The cavity is intended to be filled hydraulically with said medium, the device also comprising means for adjusting the pressure in the cavity to 1–500 bar (excess pressure), preferably 1–200 bar, and even more preferredly 1–100 bar during the actual imprint stage. During heating of the substrate, prior to the imprint stage, the pressure can be adjusted here to 1–5 bar, and following the heating, during the actual imprint stage, the pressure can be adjusted to 5–500 bar, preferably 5–200 bar and even more preferredly 5–100 bar. Naturally, the pressure can also be set to zero.

According to yet another aspect of the invention, the device also comprises means for heating, e.g. electrical or mechanical means, or means for irradiating, and means for cooling the substrate, e.g. by means of a cooling medium. Heating and cooling can be adjusted to achieve substrate temperatures typically of between 30 and 300° C.

With the device and the method according to the invention, well-defined structures of nanometer size can be created on rigid materials with total areas that are greater than 7–20 cm$^2$, e.g. materials with a maximum width or diameter of up to 150, preferably 250 mm, even more preferredly 350 mm or even larger, in a quick, easy and cheap manner. A cycle for nanoimprinting according to the invention typically takes less than four minutes, or less than 3 minutes, often around 2 minutes. The nanometer-sized structures can here be down to below 100 nm in individual structures, or below 50 nm, or even below 10 nm.

The invention is applicable to nanoimprint lithography on semiconductor materials, such as silicon, for the manufacture of semiconductor components. It has also been found surprisingly that nanoimprint lithography can be carried out by means of the invention on other semiconductor materials such as e.g. indium phosphide (InP) or gallium arsenide (GaAs). These materials differ from silicon in that they are considerably more brittle and thus considerably more sensitive to uneven force distribution on nanoimprinting. No other method or device has been presented previously that manages to carry out nanoimprinting on brittle semiconductor materials such as indium phosphide and gallium arsenide. However, the present invention can also be applied in connection with nanoimprint lithography on other rigid materials, such as ceramic materials, metals or polymers with a relatively high glass transition temperature, for use in e.g. biosensors.

DESCRIPTION OF DRAWINGS

The invention will be described in greater detail below with reference to the figures, of which:

FIG. 1 shows a first embodiment of a device according to the invention, seen from the side in cross-section, FIG. 2a shows a second embodiment of a device according to the invention, seen from the side in cross-section, and how the first main part of the device can be displaced, FIG. 2b shows the embodiment according to FIG. 2a in perspective, FIGS. 3a & 3b show the device according to FIG. 1 or 2, on pressing together the substrate and template, FIG. 4 shows a device according to the invention, seen from the side in cross-section, including devices for heating and cooling the substrate, FIG. 5 shows a front view of a device according to FIG. 4 for heating the substrate, FIG. 6 shows a front view of a device according to FIG. 4 for cooling the substrate, FIG. 7 shows an alternative method of heating the substrate, FIG. 8a shows a side view in cross-section of a device for vacuum holding of the substrate or template, FIG. 8b shows a front view of the device in FIG. 8a, FIG. 9a shows a front view of a second main part according to the invention, comprising a device according to FIG. 8.

Figure 9A:
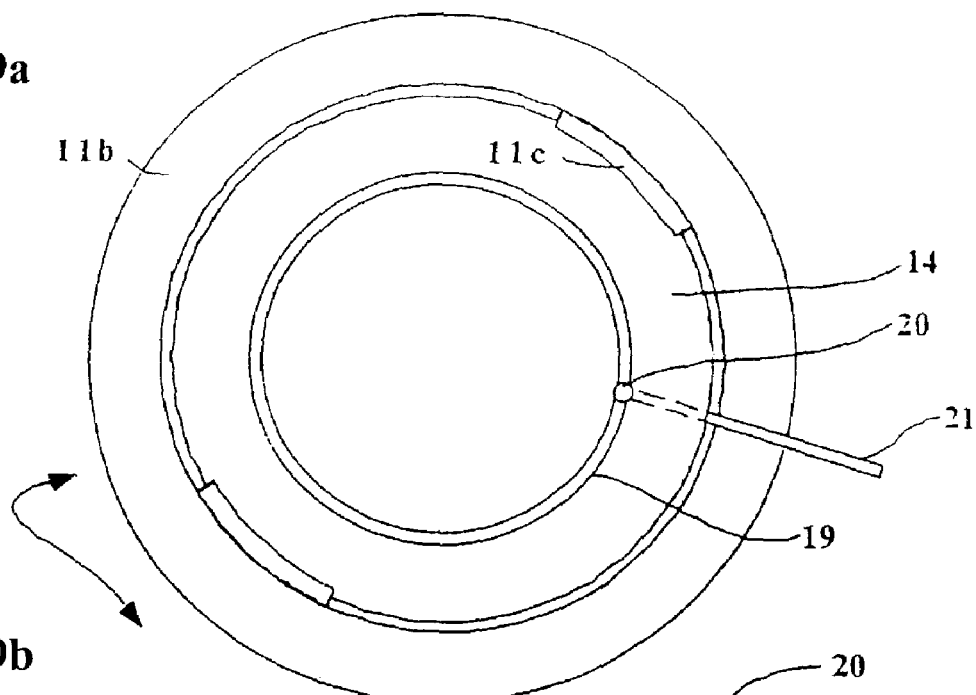
FIG. 9b shows the device according to FIG. 9a, seen from the side in cross-section.

Detail number 1 in FIG. 1 represents a first main part in a preferred embodiment of a device according to the invention. This first main part 1 comprises a first principally plane base plate 2, which is preferably arranged to be displaced in a direction that coincides with the normal for its surface 2a facing a second main part 3. A principally plane support plate 4, on which support plate the substrate 5 is intended to be placed, can be affixed to this surface 2a. Alternatively, the substrate 5 can be placed directly onto the surface 2a. The substrate consists for example, according to the known technique for nanoimprint lithography, of a silicon plate with a thin layer of e.g. a polyamide, preferably polymethyl methacrylate (PMMA) on its surface 5a facing towards the second main part 3. The substrate 5 is preferably circular. The main parts 1 and 3 preferably also have a rotationally symmetrical appearance.

The second main part 3 has a cavity 6, which is formed by a bottom 7 and, in the example shown, circular-cylindrical side walls 8. As a roof for the cavity 6, a plane, flexible membrane 9 is arranged opposite the bottom 7. This membrane 9 consists in the example shown of a rubber membrane, one side 9a of which forms a support for the template 10, and has a diameter or maximum width of 25–400 mm, preferably 50–350 mm. The membrane has a thickness of up to 10 mm, preferably up to 3 mm and even more preferredly up to 1 mm. The template 10 consists, according to the known technique for nanoimprint lithography, of a plate of e.g. metal, which is provided with a fine structural pattern, with dimensions in nanometer size, on its surface 10a facing towards the first main part 1.

The membrane 9 is fixed on the second main part 3, around the periphery of the membrane 9 at edges of the cavity 6, by means of a fixing device. A ring 11, which is circular in the example shown, is used as the fixing device, which ring is arranged to press firmly the peripheral edges of the membrane 9 between itself and the free edges of the side walls 8. Along its inner circular edge, on the side thereof that faces towards the membrane, the ring 11 is preferably bevelled 11a, to provide a soft deflection for the membrane 9 on the transition from the ring 11. The risk is hereby reduced of splits or fold notches in the membrane 9, its life being extended.

Figure 9B:
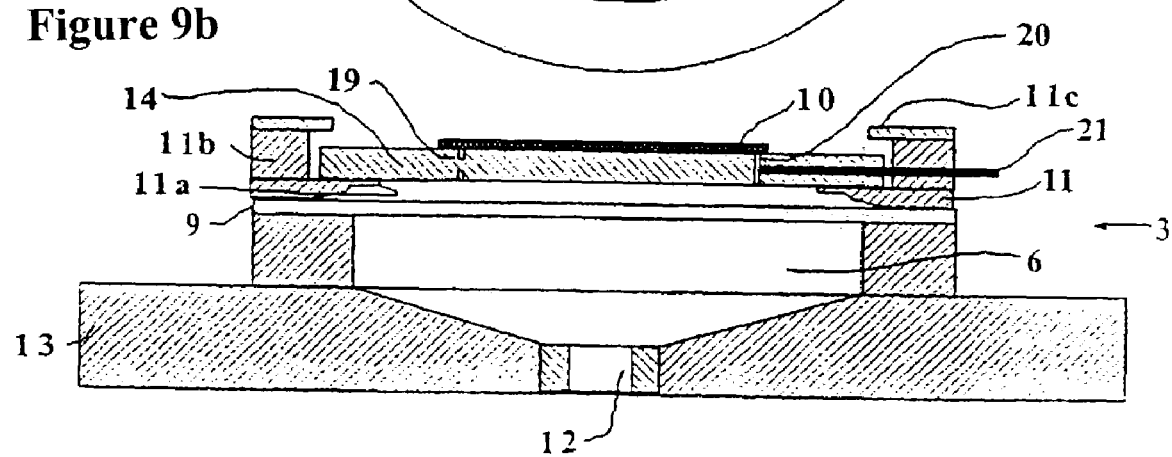

The cavity 6 is intended to accommodate a medium, preferably hydraulic oil, which can be pressurized via an inlet channel 12, which can be arranged in the side walls 8 or in the bottom 7 of the cavity (as shown in FIG. 9b). Pressurization takes place by means of a pump (not shown), which is best adapted to provide a pressure with very small variations. This can be achieved e.g. by means of a proportional valve.

Contained in the second main part 3 is also a second principally plane base plate 13, which forms a support for the part with the cavity 6.

FIG. 2a shows a second embodiment of the device according to the invention, a principally plane support plate 14 being arranged between the membrane 9 and the template 10. The support plate 14 has a thickness of 0.1–30 mm, preferably 0.1–20 mm, even more preferredly 0.1–10 mm, and most preferredly 0.1–5 mm, and can be executed in materials such as a metal, a semiconductor material, or a ceramic material, e.g. stainless steel, silicon carbide or aluminium oxide. The above-mentioned support plate 4 also best has these dimensions and is best executed in materials of the same type.

The support plate 14 on the second main part 3 consists most advantageously of a material that is a good thermal insulator, i.e. which has low thermal conductivity.

The support plate 14 forms a fixing device for the template 10, which is explained in greater detail in connection with FIG. 9. In this embodiment, the ring 11 preferably has a spacer part 11b and a lip 11c that prevents the support plate 14 from falling off the main part 3 before both main parts are brought together, at least when the main part 3 is arranged above the main part 1.

FIG. 2a also shows, by means of arrows, how the main part 1 is arranged to be displaced in relation to the main part 3 in a radial direction, i.e. in a direction that is parallel to the surfaces 2a and 9a of the main parts 1 and 3. The base plate 2 can here have a fixed part 2b facing away from the surface 2a and a movable part 2. Displacement is executed in connection with the exchange of template and/or substrate. FIG. 2b shows the embodiment according to FIG. 2a in perspective.

FIGS. 3a and b show the device according to FIG. 1 or 2 when the pressure in the cavity 6 has been increased so that the template 10 and substrate 5 are pressed together, thanks to the flexibility of the membrane 9, for transfer of the nanometer-sized structure on the surface of the template 10a to the surface 5a of the substrate.

FIG. 4 shows that the main part 1, for the substrate 5, can also comprise means 15 for heating the substrate, and means 16 for cooling the substrate. In the preferred example shown, these means 15, 16 for heating and cooling respectively consist of support plates that are arranged between the substrate 5 and the base plate 2, preferably in the order substrate 5, support plate 4 (with vacuum for holding the substrate), support plate 16 for cooling, support plate 15 for heating, and base plate 2. The support plate 15 for heating the substrate best consists of a material which has a good thermal insulation capacity, e.g. a ceramic material such as a ceramic insulator or a ceramic composite, e.g. macor. The support plate 16 for cooling the substrate best consists of a material that has good thermal conductivity, e.g. silicon carbide, stainless steel, aluminium or aluminium oxide in some form. The support plates 15 and 16 preferably have a thickness in the same range as the support plate 14 according to the above.

FIG. 5 shows how the support plate 15 can contain an electric heating coil 17, which is inlaid in a groove in the surface of the support plate 15. The heating coil/groove 17 is formed in the embodiment shown as a double coil, but can of course have other shapes also. By analogy, the support plate 16, according to FIG. 6, can contain a channel 18 inside the same for a cooling medium, e.g. a gas such as air, nitrogen or something else, or a cooling liquid such as water or something else. The channel 18 in the embodiment shown is formed as a double coil, but can of course also have other forms.

FIG. 7 shows an alternative embodiment, in which heating of the substrate 5 is carried out by means of irradiation R' of the substrate via the base plate 2 and a support plate 4 or 16. The radiation R' used can for example be of the IR radiation type (the support plate 16 best being executed in silicon carbide) or radiation using radio frequencies, i.e. frequencies of 10 MHz and above, the device comprising means (not shown) for generating such radiation.

FIGS. 8a and b show how the support plate 4 can be provided with devices for vacuum holding of the substrate 5. The support plate here has a groove 19 in both surfaces of the support plate 4, a circular groove in the example shown. The two grooves 19 are joined to one another at one point 20 at least by a hole that is continuous through the plate 4. A vacuum is created in the groove 19 and hole 20 by a connection (not shown) to a vacuum fan, via the base plate 2. By means of this vacuum device the substrate 5 is sucked firmly onto the support plate 4 and the support plate 4 in turn is sucked firmly onto the support plate 16 for cooling, or directly onto the base plate 2. It is to be perceived that also, or alternatively, the support plate 15 for heating and/or the support plate 16 for cooling can be provided with devices for vacuum holding onto the support plate 4 and the base plate 2.

FIGS. 9a and 9b show that the support plate 14 arranged in this case between the template 10 and the membrane 9 can also consist of a support plate with a vacuum device 19, 20. Provided for the groove 19 and the hole 20, preferably directly connected to the hole 20, in this case is a channel 21 for connection to a vacuum fan (not shown). In this case also, a bevelled part 11a can be provided on the ring 11, which part 11a can lie between the membrane 9 and the vacuum support plate 14. FIG. 9a shows the support plate 14 without a template thereon, while FIG. 9b shows a support plate 14 with a template thereon. It is also shown how the inlet channel 12 can be arranged in the bottom of the main part 3, via the base plate 13.

The manufacturing cycle for nanoimprinting of a substrate 5 shall be described below starting out from the figures. In the starting phase, both main parts 1 and 3 are displaced relative to one another in an axial and radial direction, according to FIG. 2. The substrate 5 is placed on the support plate 4 and the template 10 placed on the membrane 9 or support plate 14. The substrate and template are best held in place by means of a vacuum, but other methods are also conceivable. The first main part 1 is displaced in a radial direction into position in relation to the second main part 3, in order then to be displaced in an axial direction towards the same. In that connection displacement is best executed in an axial direction so that a small interval continues to remain of e.g. up to 10 mm, preferably up to 5 mm and even more preferredly up to 1 mm, between the ring 11 and the support plate 4 or base plate 2 if the support plate 4 is lacking This is shown in FIG. 3a. Alternatively, the axial displacement takes place so that the ring 11 or its lip 11c abuts the support plate 4 or base plate 2. This is shown in FIG. 3b, the dimensions of the constituent components being adapted so that there continues to remain a small interval, corresponding to the above mentioned interval, between the substrate 5 and the template 10 when the two main parts 1 and 3 come together.

Following the axial displacement of the main parts, the pressure of the medium in the cavity is increased via the inlet channel 12 to around 1–5 bar so that the membrane 9 flexes out, a light pressing together of the substrate 5 and template 10 taking place. The substrate 5 is heated by means of a device for heating the same, e.g. according to FIG. 5 or 7, and then the pressure of the medium in the cavity 6 is increased to 5–500 bar, preferably 5–200 bar, and even more preferredly 5–100 bar, via the inlet channel 12, the substrate 5 and the template 10 being pressed together with a corresponding pressure, which pressure is transferred via the flexible membrane 9. Thanks to the flexible membrane, an absolutely even distribution of force is obtained over the whole of the contact surface between the substrate and the template, these being made to arrange themselves absolutely parallel in relation to one another and the influence of irregularities in the surface of the substrate or template being eliminated. Following a compression time depending on the choice of material, temperature, pressure etc., but which is typically less than 3 minutes, preferably less than 1 minute, cooling of the substrate commences by means of a device e.g. of the type shown in FIG. 6. When cooling has been completed, the pressure in the cavity 6 is reduced and the two main parts 1 and 3 are separated from one another, following which the substrate 5 and template 10 are separated from one another. After this, the substrate is subjected to further treatment according to what is known for nanoimprint lithography. This further treatment is not a part of the present invention, and will not therefore be described in greater detail.

Figure 10A:
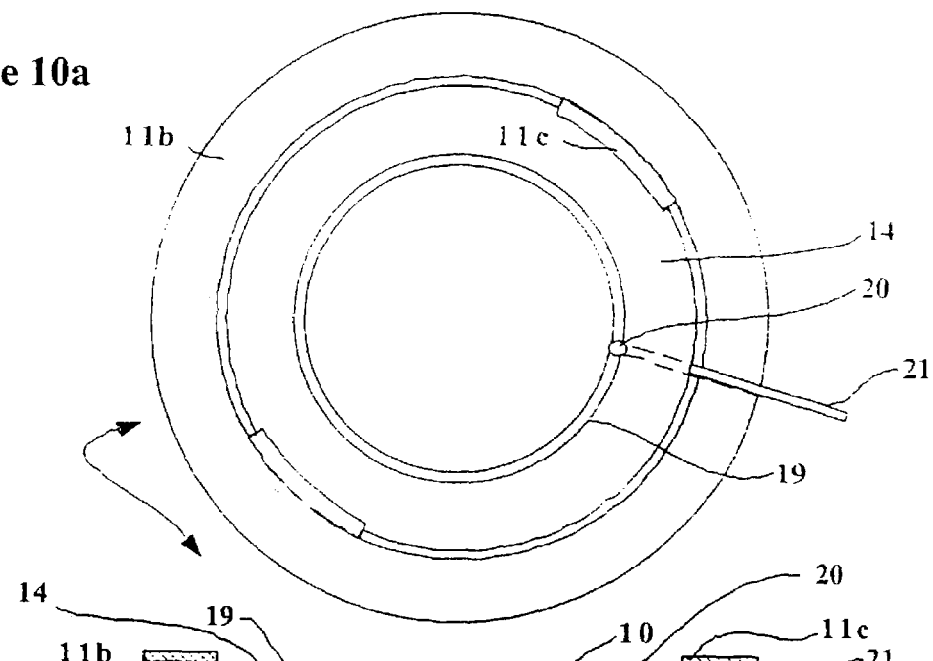
FIG. 10a shows a front view of an alternative embodiment of a second main part according to the invention, comprising a device according to FIG. 8.
Figure 10B:
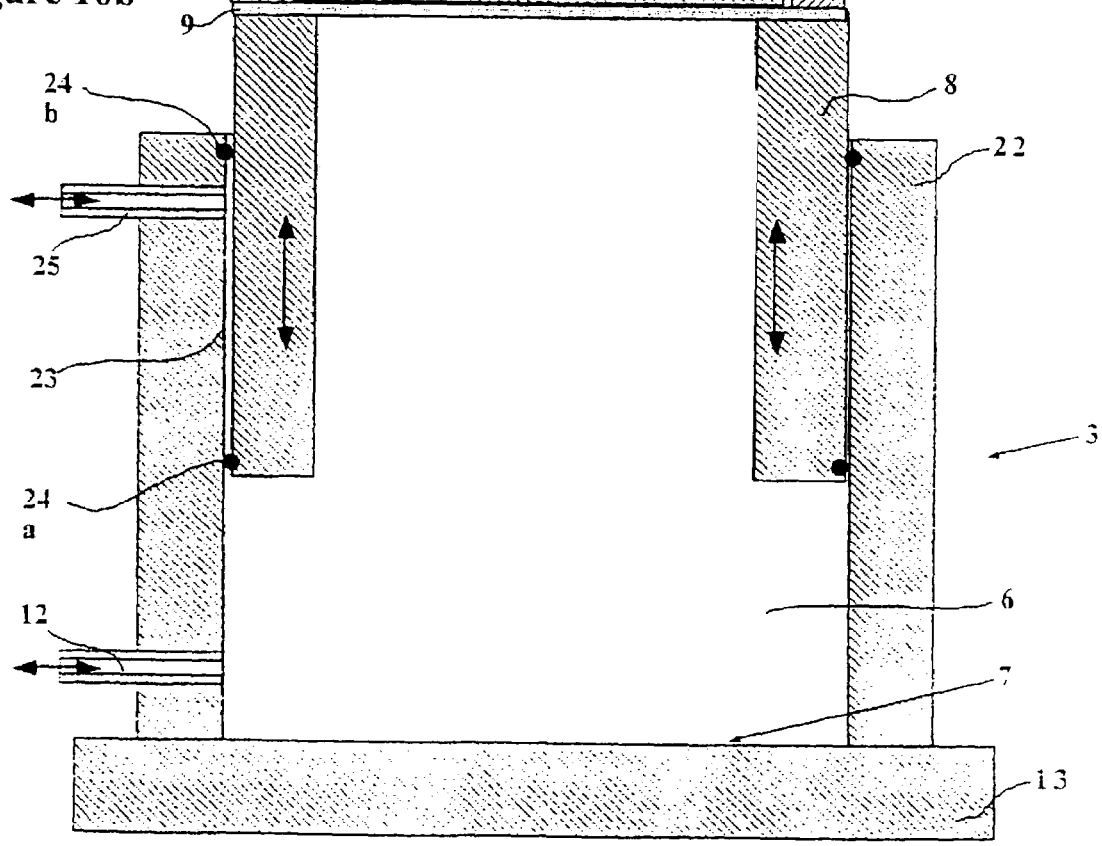
FIG. 10b shows the device according to FIG. 10a, seen from the side in cross-section.

FIG. 10a shows a support plate 14 without a template thereon, while FIG. 10b shows a support plate 14 with a template thereon. FIGS. 10a and 10b here show an alternative embodiment of the invention, in which the second main part 3 is formed as a periscopic part for the axial displacement of the same. Here the cavity 6 with its medium and related (not shown) pump is used also for the periscopic displacement Arranged here outside the side walls 8 are outer walls 22 with only a small gap 23 between them. Arranged at the end of the side walls 8 and the outer walls 22 respectively are sliding seals 24a and 24b respectively. It is best if devices (not shown) are also provided to prevent the part with the side walls 8 being displaced so far that it comes loose from the outer walls 22. The outer walls 22 are limited at the other ends by the cavity's bottom 7 or base plate 13. The inlet channel 12 is arranged in the outer walls 22, or in the bottom 7, 13, i.e. in the area outside the gap 23. Arranged in the area of the gap 23 is a second inlet channel 25, by means of which the quantity of medium in the gap 23, and its pressure, can be influenced. The periscopic displacement of the main part 3, or rather of the membrane 9 and template 10 is achieved by increasing the pressure in the cavity 6 via the inlet channel 12, at the same time as the medium in the gap 23 is permitted to flow out via the second inlet channel 25. When the ring 11, or its lip 11c, abuts the first main part 1 (not shown in FIG. 10), a continued increase in the pressure in the cavity will result in the membrane 9 translating the pressure to the template, so that this is pressed together with the substrate, as described above.

To retract the periscopic main part 3, following the completion of imprinting, the pressure in the cavity 6 is released and the pressure in the gap 23 increased instead via the second inlet channel 25. The side walls 8 are thereby displaced, and with them the membrane 9 and the template 10, towards the base plate 13, the sliding seals 24a and 24b sliding against the outer walls 22 and the side walls 8 respectively.

Figure 11A:
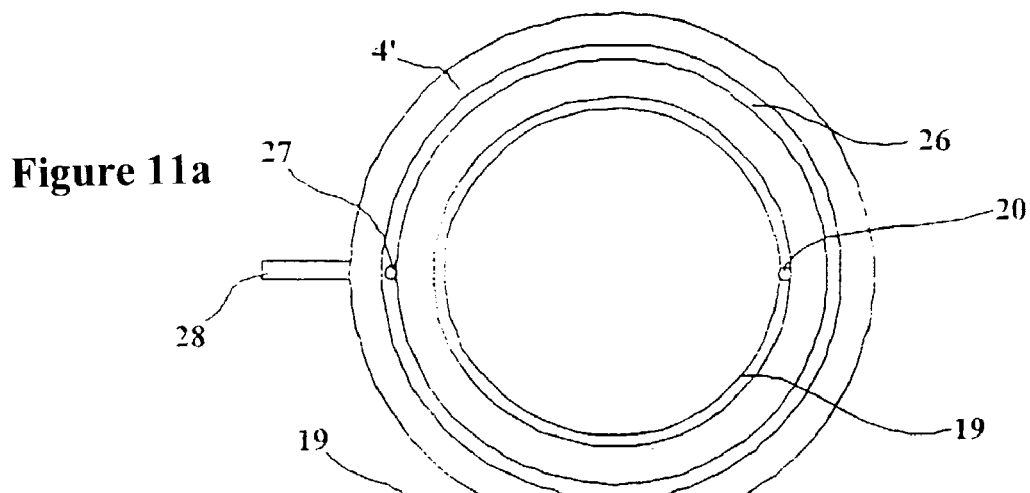
FIG. 11a shows a front view of an alternative device for vacuum holding of the substrate and template.
Figure 11B:
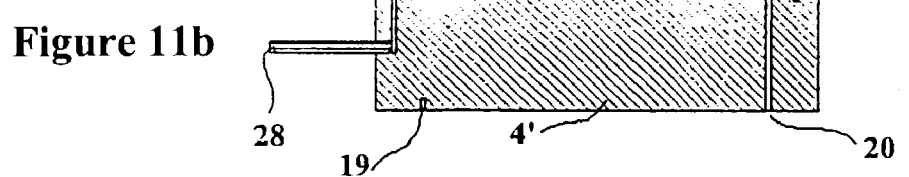
FIG. 11b shows a side view in cross-section of the device according to FIG. 11a, FIG. 11c shows the device according to FIG. 11b, in side view in cross-section with substrate and template thereon.
Figure 11C:
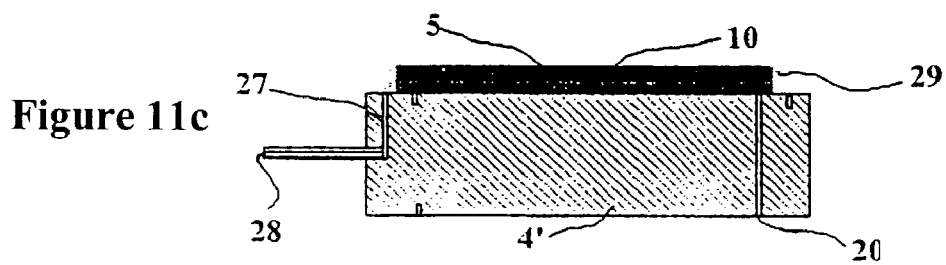

FIGS. 11a, b and c show an alternative device for vacuum holding of the substrate and template, which device consists of a support plate of the same type as before, in connection with FIG. 1, named support plate 4, named 4' in this figure. The support plate 4' is provided, in the same manner as shown in FIG. 8, with a groove 19 in both of its plane surfaces and a through hole 20, which runs below to a vacuum connection (not shown) to achieve a vacuum which holds the substrate 5 firmly on one surface of the support plate 4' and holds the support plate 4' firmly on a base, e.g. a support plate for cooling the substrate 5, not shown in this figure. Arranged on one side only of the support plate 4', outside the groove 19, is a second vacuum groove 26, in the example shown a circular groove 26 with a diameter that is greater than the diameter of the template 10 and the substrate 5. Provided for the groove 26, at best via a hole 27, is a channel 28 for connection to a vacuum fan, not shown. The substrate 5 can be held firmly by means of the support plate 4' by the first vacuum groove 19, the template 10 being able to be placed directly onto the substrate 5, and following this, as shown in FIG. 11c, a film or foil 29 e.g. of aluminium or rubber can be placed completely covering or running around the periphery of the template and substrate, which film or foil is sucked fast against the vacuum groove 26 and thereby holds the template 10 firmly against the substrate 5. Thanks to the device shown in FIG. 11, the substrate 5 and template 10 can thus be placed together, as shown in FIG. 11c, on one main part 1, 3, of the device, following which the main parts are displaced in relation to one another, so that they are oriented over one another and close to one another, as described earlier. Following the imprint stage, the vacuum in the groove 19 can be released, while the vacuum in the groove 26 is maintained, the support plate 4' being able to be removed from the device with the template and substrate still there for a simple exchange of substrate.

Figure 12A:
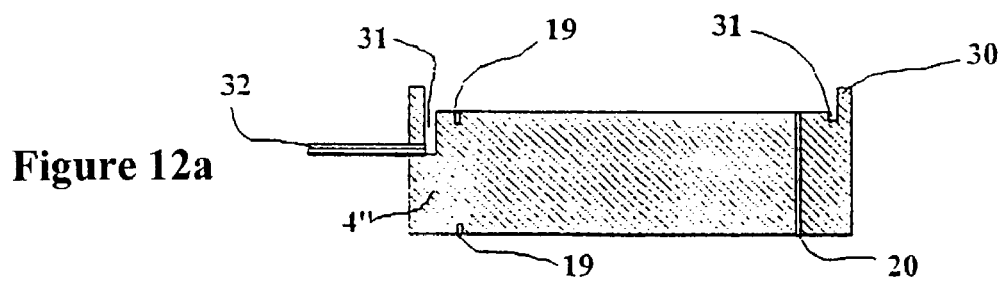
FIG. 12a shows a side view in cross-section of yet another alternative device for vacuum holding of substrate and template.
Figure 12B:
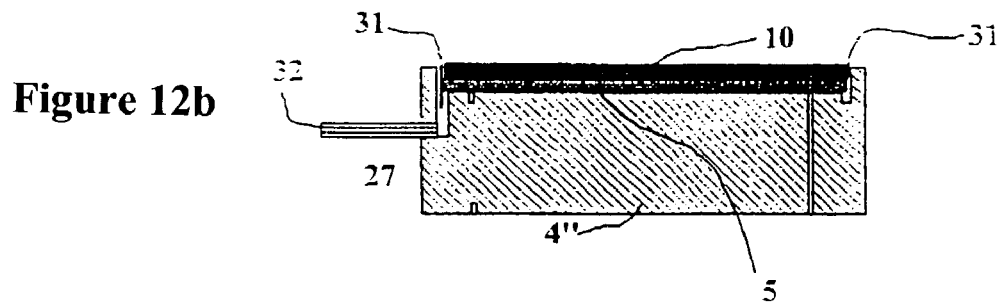
FIG. 12b shows the device according to FIG. 12a, in side view in cross-section with substrate and template thereon.

FIGS. 12a and b show yet another alternative device for vacuum holding of the substrate and template, which device consists of a support plate of the same type as before, in connection with FIG. 1, named support plate 4, in this figure named 4". The support plate 4" is provided, in the same manner as shown in FIG. 8, with a groove 19 in both of its plane surfaces and a through hole 20, which runs below to a vacuum connection (not shown) to achieve a vacuum which holds the substrate 5 firmly on one surface of the support plate 4' and holds the support plate 4' firmly on a base, e.g. a support plate for cooling the substrate 5, not shown in this figure. Arranged in the support plate 4' is a raised edge 30 outside the groove 19 on one side of the support plate, and a groove 31 in the angle between the edge 30 and the support plate 4", which groove 31 is connected to a vacuum channel 32. FIG. 12a shows the support plate 4" without a template and substrate thereon, while FIG. 12b shows a support plate 4" with a template 10 and substrate 5 thereon, inside the edge 30. The dimensions are adapted so that there is only a small gap between the edge 30 and the substrate/template, through which gap air is sucked into the vacuum channel 32. Both the template and substrate are hereby held firmly, the same function as in FIG. 11 being able to be achieved. The edge 30 has a height that exceeds the thickness of the substrate 5 (or the template 10 if this is to be placed closest to the support plate 4").

EXAMPLES

Imprint trials according to the invention were conducted according to the following parameters: the substrate was 5.1 cm in diameter in $Si/SiO_2$, with a coating of 950 K PMMA which was oven-baked at 180° C. for 24 hours. The maximum pressure was 60 bar, max. temperature 170° C. and min. temperature 80° C. The template was 5.1 cm in diameter in $Si/SiO_2$, with template structures in the form of lines and dots with line widths of 50, 75, 100 and 150 nm, and diameters of 50 nm with a distance of 25 nm between the dots. The template was provided with a protective layer of nickel with a thickness of 20 nm, which was deposited by vaporization. The template was cleaned before imprinting by immersing it in acetone under the influence of ultrasound, and dried using nitrogen gas.

Figure 13:
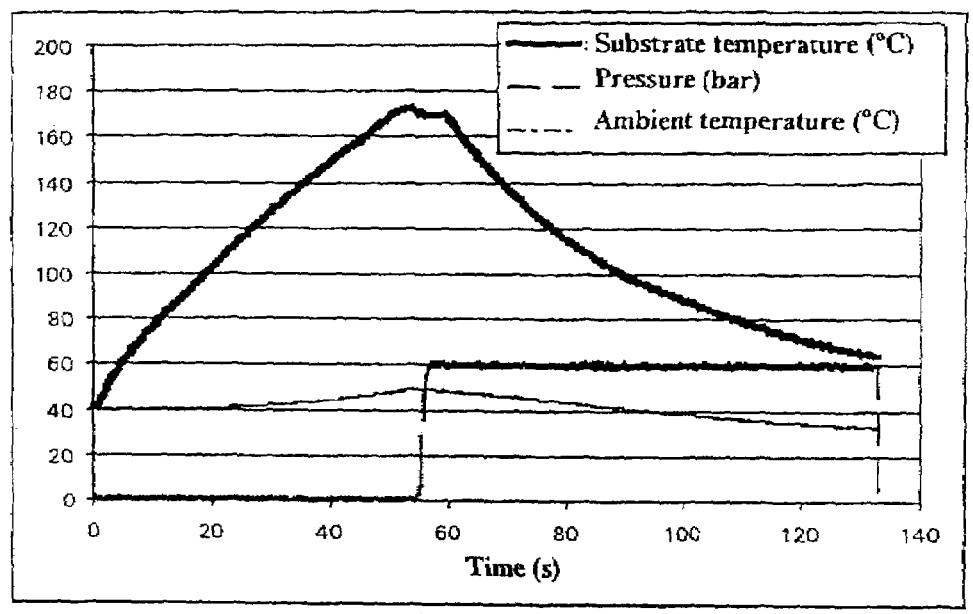
FIG. 13 shows a diagram of substrate temperature and pressure, as a function of time, for a production cycle.

FIG. 13 shows a diagram of substrate temperatures and pressures as a function of time for the production cycle, which extended over a little more than 2 minutes in a device according to the invention. As shown in the diagram, the time for the temperature increase was roughly 1 minute. Pressure was then loaded, via the membrane, and when the desired maximum pressure was reached, cooling of the substrate commenced. During cooling, the pressure was adjusted to the desired set point.

The trials showed that a pressure of around 60 bar gave an impression 200 nm deep in the PMMA layer on the substrate. If greater depth is desired, a higher pressure can be used.

Following 10 cycles with the same template, it could be confirmed that the entire surface of all substrates was evenly imprinted. No significant variations in the structure could be observed in or between the areas with different structure.

Around 50 nm PMMA remained in the impressions, which was removed by etching. Following etching, the profile on the surface of the substrate had near enough vertical walls. Following etching, the substrate was coated in the impressions with Cr, by vaporization, and then a stage was executed to remove the remaining PMMA, resulting in a successful metal coating in the impressions.

Figure 14A:
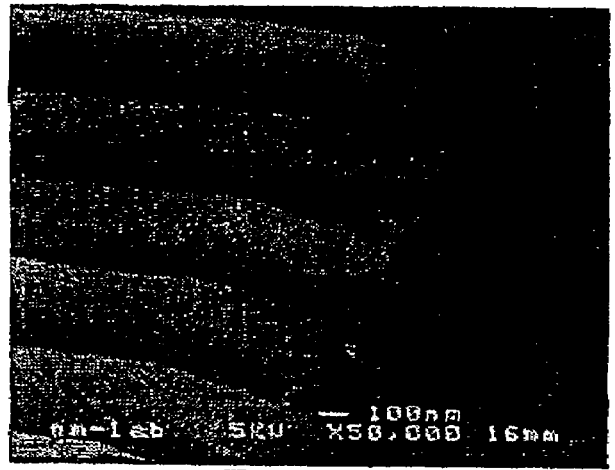
FIG. 14a shows a scanning electron microscope picture of a template.
Figure 14B:
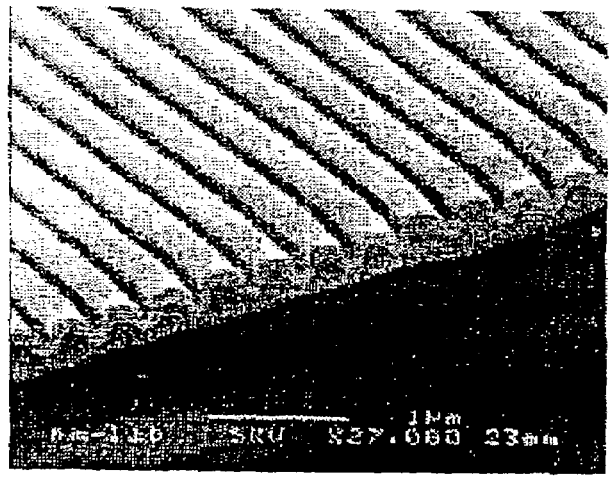
FIGS. 14b–d shows scanning electron microscope pictures of various nanometer-size structures achieved by means of the device and method according to the invention.

FIG. 14a shows a scanning electron microscope picture of a part of a template with lines/ recesses 100 nm wide and a gap distance of 300 nm between the lines. The total surface of the template was 25 $cm^2$. FIG. 14b shows a part of a substrate in which a layer of PMMA has been imprinted with the template in FIG. 14a, in a device according to the invention. The structure arising is very regular and devoid of defects.

Figure 14C:
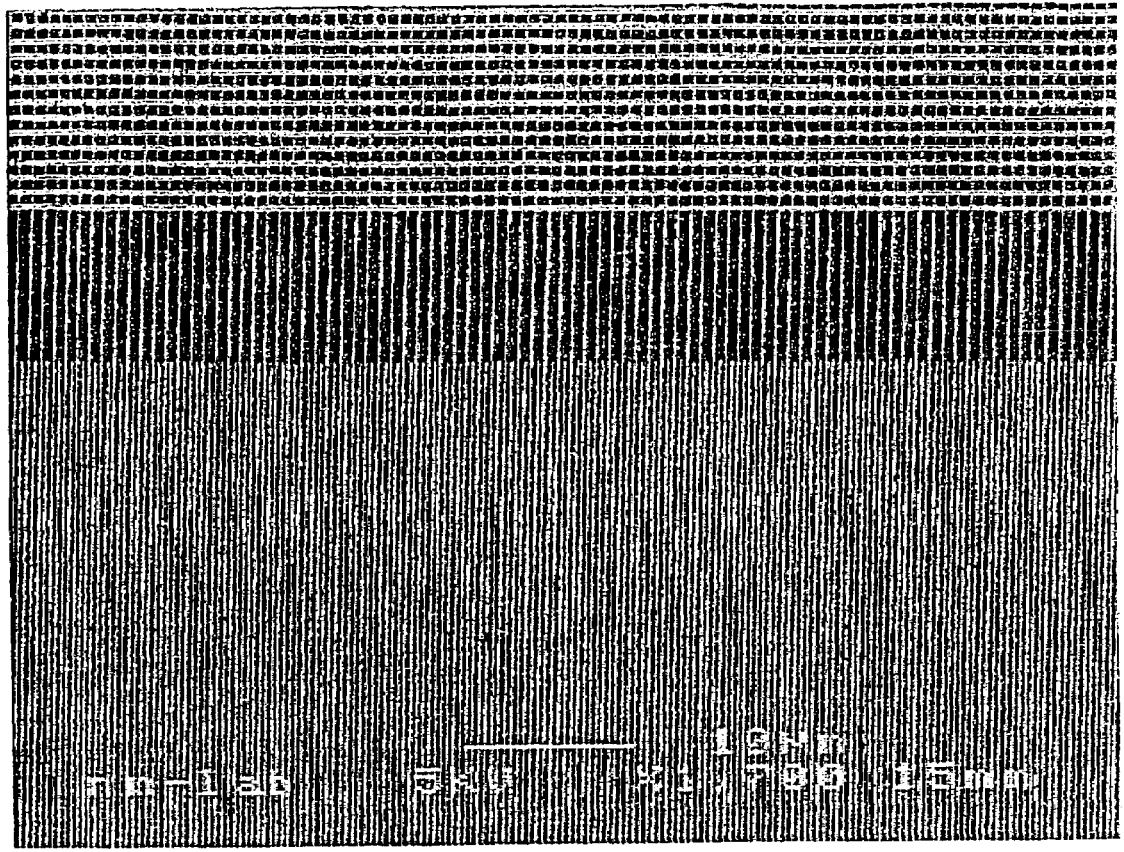

FIG. 14c shows an aluminium-metallized surface of a substrate of silicon that has been imprinted in a device according to the invention, with lines of 100 nm, with 200 nm and 500 nm gap distances between the lines. In the picture shown, the imprinted surface has been metallized with aluminium and then PMMA has been removed. The total surface of the substrate was 25 $cm^2$.

Figure 14D:
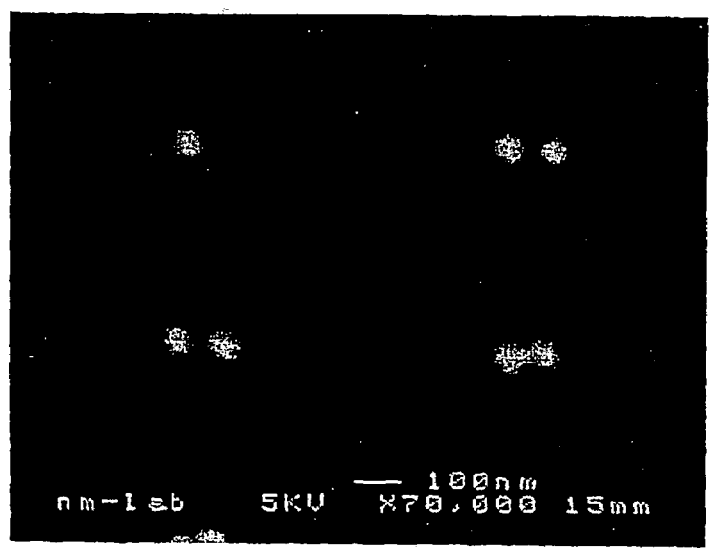

FIG. 14d shows aluminium dots of a size of 50 nm produced on a silicon substrate, by imprinting in PMMA in a device according to the invention. The dots have been made with varying gap distances on a total surface of 25 $cm^2$. In the picture shown, the imprinted surface has been metallized with aluminium and the PMMA then removed. The minimum gap distance is judged to be less than 25 nm.

The invention is not restricted to the embodiments and examples described above, but can be varied within the scope of the following claims. Thus it is easily perceived for example for the template and substrate to change places with one another in the figures shown. It is also perceived that conventional measures in connection with nanoimprinting should be carried out, such as cleaning of the surfaces of the substrate and template, and the space between them, using pure particle-free gas, e.g. nitrogen gas or another gas. Furthermore, it is perceived that the attachment of the membrane, formation of the cavity etc. can be executed in essentially different ways, without deviating from the idea according to the invention due to this.

The invention claimed is:

1. Device for nanoimprint lithography, which device comprises a first main part with a first principally plane surface and a second main part with a second principally plane surface, said first surface and second surface being opposite to one another and being arranged in principle parallel in relation to one another, with an adjustable interval between them, and said first surface being arranged to form a support for a substrate and said second surface being arranged to form a support for a template or template assembly wherein said second main part also comprises a cavity for a medium, and means for adjusting a pressure of said medium to a pressure within the range of 1–500 bar positive pressure, a wall of said cavity consisting of a flexible membrane, of which one side, which side faces away from the cavity, forms said second surface entirely supporting said template or template assembly, said template or template assembly being supported only by said membrane and said pressure medium therebehind during nanoimprinting.

2. Device according to claim 1, characterized in that said membrane (9) is fixed to the second main part (3) around the periphery of the membrane, preferably by means of a ring (11) which braces the membrane's periphery against the second main part.

3. Device according to claim 1 or 2, characterized in that the membrane (9) consists of a flexible material, preferably a polymer material or a thin metal, even more preferredly plastic, rubber or thin metal, the membrane having a thickness of up to 10 mm, preferably up to 3 mm and even more preferredly up to 1 mm.

4. Device according to claim 1, characterized in that said membrane (9) has a maximum width, preferably a diameter, of 25–400 mm, preferably 50–350 mm.

5. Device according to claim 1, characterized in that said medium consists of a gas or a liquid of low compressibility, preferably an oil and even more preferredly hydraulic oil.

6. Device according to claim 1, characterized in that said means for adjusting the pressure of said medium is arranged to adjust the pressure to a pressure within the range of 1–200 bar, preferably 1–100 bar.

7. Device according to claim 1, characterized in that said first (2a) and second (9a) surface are arranged to be displaced in relation to one another in a direction which coincides with the normal for the surfaces, and preferably also in a direction which is parallel to the surfaces.

8. Device according to claim 7, characterized in that said second surface (9a) is arranged to be displaced periscopically towards said first surface (2a), in a direction that coincides with the normal for the surfaces, said second main part (3) comprising a periscopically displaceable part (8, 9) which is arranged to be displaced by means of adjusting the pressure of said medium.

9. Method of nanoimprint lithography, hereafter termed nanoimprinting, a substrate (5) and a template (10) being placed between a first surface (2a) and a second surface (9a), which first and second surfaces are opposite to one another, principally plane and principally parallel in relation to one another, characterized in that said second surface (9a) consists of one side of a flexible membrane (9), a pressure, of 1–500 bar positive pressure being created in a medium on the other side of said membrane and lifting said template or said substrate free from any support other than said membrane, so that the template and substrate are pressed together, while said first surface (2a) acts as a dolly.

10. Method according to claim 9, characterized in that said first (2a) and second (9a) surface are first displaced towards one another, before pressurization of the membrane's (9) other side is executed.

11. Method according to claim 9, characterized in that said pressure, during compression, is adjusted to 5–500 bar, preferably 5–200 bar and even more preferredly 5–100 bar.

12. Method according to claim 9, characterized in that said substrate (5) is first heated, electrically, mechanically or by irradiation, following which the template (10) and substrate (5) are pressed together due to said pressurization, that the substrate is then cooled, by means of a cooling medium, following which the template and substrate are separated from one another.

13. Method according to claim 9, characterized in that a cycle for nanoimprinting is executed in a time of less than 4 minutes, preferably 1–3 minutes.

14. Device for nanoimprint lithography, which device comprises a first main part (1) with a first principally plane surface (2a) and a second main part (3) with a second principally plane surface (9a), said first surface and second surface being opposite to one another and being arranged in principle parallel in relation to one another, with an adjustable interval between them, and said first surface (2a) being arranged to form a support for a template (10) and said second surface being arranged to form a support for a substrate or substrate assembly wherein said second main part (3) also comprises a cavity (6) for a medium, and means for adjusting a pressure of said medium to a pressure within the range of 1–500 bar positive pressure, a wail of said cavity consisting of a flexible membrane (9), of which one side, which side faces away from the cavity (6), forms said second surface (9a), entirely and supporting said substrate or substrate assembly, said substrate or substrate assembly being supported only by said membrane and said pressure medium therebehind during nanoimprinting.

15. Device according to claim 14, characterized in that said membrane (9) is fixed to the second main part (3) around the periphery of the membrane, preferably by means of a ring (11) which braces the membrane's periphery against the second main part.

16. Device according to claim 14, characterized in that the membrane (9) consists of a flexible material, preferably a polymer material or a thin metal, even more preferredly plastic, rubber or thin metal, the membrane having a thickness of up to 10 mm, preferably up to 3 mm and even more preferably up to 1 mm.

17. Device according to claim 14, characterized in that said membrane (9) has a maximum width, preferably a diameter, of 25–400 mm, preferably 50–350 mm.

18. Device according to claim 14, characterized in that said medium consists of a gas or a liquid of low compressibility, preferably an oil and even more preferably hydraulic oil.

19. Device according to claim 14, characterized in that said means for adjusting the pressure of said medium is arranged to adjust the pressure to a pressure within the range of 1–200 bar, preferably 1–100 bar.

20. Device according to claim 14, characterized in that said first (2a) and second (9a) surface are arranged to be displaced in relation to one another in a direction which coincides with the normal for the surfaces, and preferably also in a direction which is parallel to the surfaces.

21. Device according to claim 20, characterized in that said second surface (9a) is arranged to be displaced periscopically towards said first surface (2a), in a direction that coincides with the normal for the surfaces, said second main part (3) comprising a periscopically displaceable part (8, 9) which is arranged to be displaced by means of adjusting the pressure of said medium.

22. Device according to claim 1 or 14, characterized in that at least one support plate (4, 4', 4", 14, 15, 16) is arranged between said first (2a) and/or second (9a) surface and said substrate (5) or template (10), which support plate has a thickness of 0.1–30 mm, preferably 0.1–20 mm, even more preferably 0.1–10 mm and most preferably 0.1–5 mm.

23. Device according to claim 22, characterized in that said support plate (4, 4', 4", 14, 15, 16) is ranged to be held firmly against said surface (2a, 9a), and/or 25 against another support plate (4, 4', 4", 14, 15, 16) and/or against said substrate (5) and/or template (10), by means of a vacuum, the device also comprising means (19, 20, 21, 26, 27, 28, 29, 30, 31, 32) for creating such a vacuum.

24. Device according to claim 22, characterized in that one (16) of said at least one support plate has channels (18) for a cooling medium.

25. Device according to claim 22, characterized in that one (15) of said at least one support plates arranged to heat up electrically (17), mechanically or by irradiation (R').

* * * * *